(12) United States Patent
Johnson et al.

(10) Patent No.: US 9,232,569 B2
(45) Date of Patent: Jan. 5, 2016

(54) SOLID STATE LIGHT SOURCE ASSISTED PROCESSING

(71) Applicant: APPLIED MATERIALS, INC., Santa Clara, CA (US)

(72) Inventors: Joseph Johnson, Palo Alto, CA (US); John Gerling, Livermore, CA (US); Klaus Schuegraf, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 333 days.

(21) Appl. No.: 13/779,004

(22) Filed: Feb. 27, 2013

(65) Prior Publication Data

US 2014/0238970 A1    Aug. 28, 2014

(51) Int. Cl.
*A21B 1/00*    (2006.01)
*H05B 3/00*    (2006.01)
*H01L 21/67*    (2006.01)

(52) U.S. Cl.
CPC ........ *H05B 3/0038* (2013.01); *H01L 21/67115* (2013.01)

(58) Field of Classification Search
None
See application file for complete search history.

(56) References Cited

U.S. PATENT DOCUMENTS

2011/0293831 A1*   12/2011   Sferlazzo ................. 427/255.28

* cited by examiner

*Primary Examiner* — Shawntina Fuqua
(74) *Attorney, Agent, or Firm* — Moser Taboada; Alan Taboada

(57) ABSTRACT

Apparatus for providing pulsed or continuous energy in a process chamber are provided herein. The apparatus may include a lamphead including a set of lamps, wherein the first set of lamps are not solid state light sources, and a set of solid state light sources disposed on the lamp head, to provide pulsed or continuous energy to the process chamber.

16 Claims, 6 Drawing Sheets

SOLID STATE LIGHT SOURCE ASSISTED PROCESSING

FIELD

Embodiments of the present invention generally relate to semiconductor processing systems and, more specifically, to solid state light sources for use in semiconductor processing systems.

BACKGROUND

Several applications that involve the thermal processing of substrates such as semiconductor wafers and other materials involve the process steps of rapidly heating and cooling a substrate. Examples of such processing include rapid thermal processing (RTP), physical vapor deposition (PVD) processing, and the like, which are used for a number of semiconductor fabrication processes.

During semiconductor fabrication processing, heat energy from lamps is radiated into the process chamber and onto a semiconductor substrate in the processing chamber. In this manner, the substrate is heated to a required processing temperature. Typically, the use of conventional lamps (tungsten-halogen, mercury vapor, arc discharge) or electrical heating elements has been the dominant approach to delivering energy to the substrate for dopant annealing, film deposition, or film modification. These processes are often thermally based and typically require high process temperatures ranging from 200 C to 1600 C, which can result in significant thermal budget issues that adversely affect device performance.

In addition, the use of conventional lamps has associated high maintenance costs with respect to operating lifetime, material and energy usage. Conventional lamps emit radiation over a broad spectrum of wavelengths which can be detrimental to some instrumentation and/or result in an unintended response in the target substrate/film from the undesired wavelengths.

Accordingly, the inventors have provided an improved heat source apparatus for use in semiconductor processing systems.

SUMMARY

Apparatus for providing pulsed or continuous energy in a process chamber are provided herein. The apparatus may include a lamp head including a set of lamps, wherein the first set of lamps are not solid state light sources, and a set of solid state light sources disposed on the lamp head, to provide pulsed or continuous energy to the process chamber.

In some embodiments, an apparatus for providing pulsed or continuous energy in a process chamber may include a shower head including a plurality of gas delivery nozzles to provide process gases to the process chamber to process a substrate, and a set of solid state light sources disposed on the shower head, to provide pulsed or continuous energy to the process chamber.

In some embodiments, an apparatus for providing pulsed or continuous energy in a process chamber may include a process chamber body of the process chamber having an upper portion including a lid, a substrate support disposed in a lower portion of the process chamber body to support a substrate when disposed thereon, an energy source array including a plurality of solid state light sources to provide pulsed or continuous energy to the process chamber, and a transfer robot movably for transferring the heat source array to and from the process chamber body between the lid and the substrate support.

Other embodiments and variations of the present invention are disclosed in greater detail below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

Figure 1:
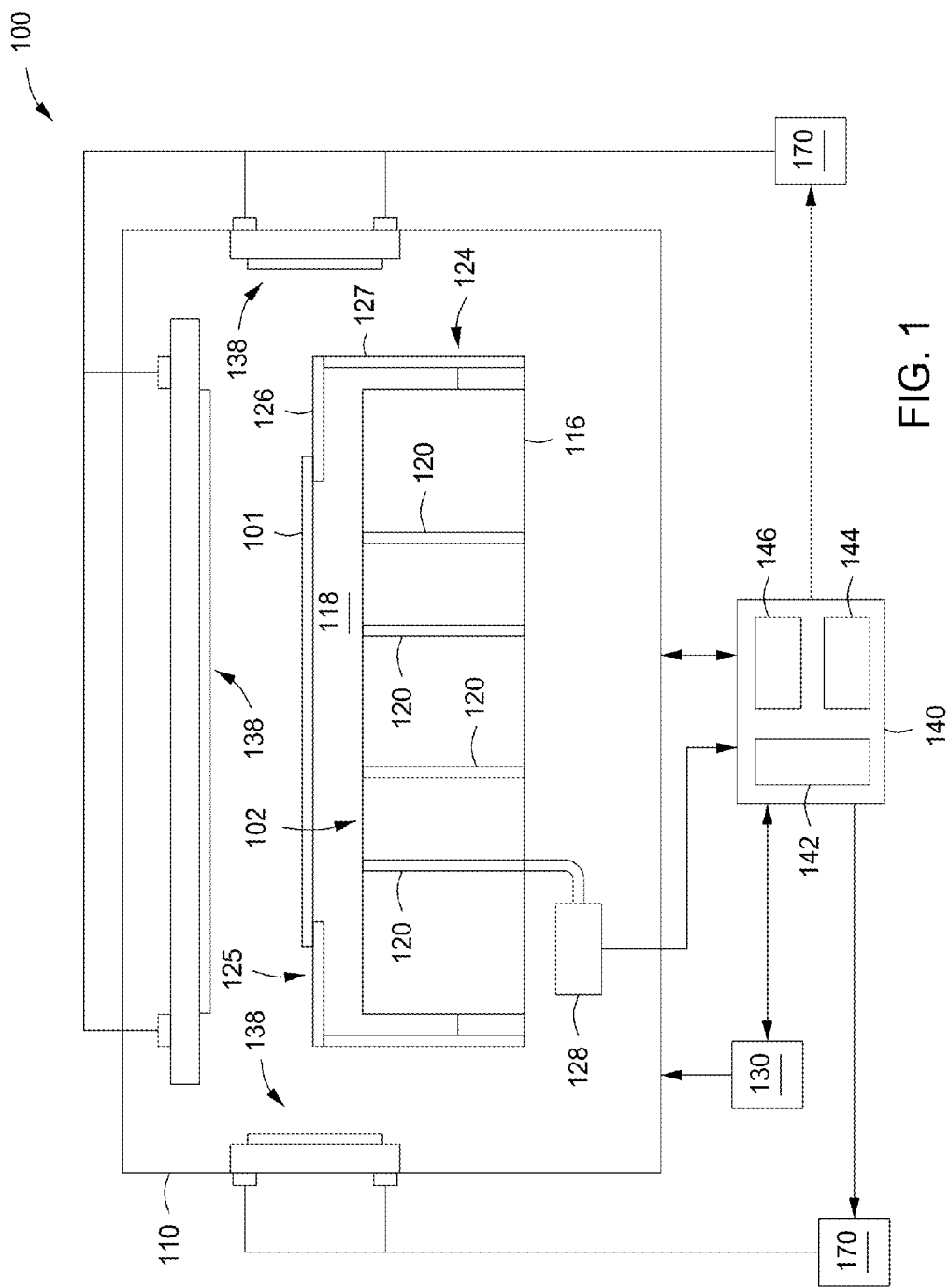
FIG. 1 is a schematic, cross-sectional view of a semiconductor substrate process chamber in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of an apparatus for providing pulsed or continuous energy in a process chamber are provided herein. In some embodiments, the inventive apparatus may advantageously provide improved heating of substrates and other components disposed in a process chamber through the use of solid state light sources.

In the following description, the term substrate is intended to broadly cover any object that is being processed in a thermal process chamber. The term substrate may include, for example, semiconductor wafers, flat panel displays, glass plates or disks, plastic workpieces, and the like. In the following description solid state light point sources include light emitting diodes (LEDs) and LASERs. In addition, although described below in terms of LEDs or arrays of LEDs, LASERs and arrays of LASERs, other solid state light point sources may be used interchangeably in embodiments described herein.

FIG. 1 depicts a schematic of an exemplary process chamber 100 configured to perform thermal processes, such as a rapid thermal process (RTP), and suitable for use with the inventive LED source for heating substrates in accordance with some embodiments of the present invention. The process chamber 100 may be any type of process chamber having a substrate support configured to support a substrate (e.g., process chamber that includes a substrate support ring, a susceptor which holds the substrate in multiple places, air jets which holds the substrate in place) and having a reflector plate located along a back side of the substrate. Examples of suitable process chambers includes any of the RADIANCE®, RADIANCE® PLUS, or VANTAGE® process chambers, or any other process chamber capable of performing a thermal process, for example RTP, all available from Applied Materials, Inc., of Santa Clara, Calif. Other suitable process chambers, including those available from other manufacturers may also be used and/or modified in accordance with the teachings provided herein. For example, other suitable process chambers that may utilize the inventive LED source for heating substrates described herein include Physical Vapor Deposition (PVD) chambers, Chemical Vapor Deposition (CVD) chambers, Epitaxial Deposition chambers, etch chambers, Atomic Layer Deposition (ALD) chambers, etc.

The process chamber 100 may, for example, be adapted for performing thermal processes and illustratively comprises a chamber body 110, support systems 130, and a controller 140 that includes of a CPU 142, memory 144, and support circuits 146. The process chamber 100 depicted in FIG. 1 is illustrative only and other process chambers, including those configured for processes other than RTP, may be modified in accordance with the teachings provided herein.

The process chamber 100 includes a energy source 138, which may include a plurality of LEDs or array(s) of LEDs arranged in zones, wherein each zone of LEDs is separately controllable. In some embodiments, the energy source 138 may be a conventional lamp augmented with LEDs strewn about areas of the lamp head that had previously not been a light-emitting surface, increasing usage of the heat source surface area.

In FIG. 1, energy sources 138 are shown above the substrate 101 for heating an upper surface of the substrate 101, and on each side of the substrate 101 (which may be used, for example, to heat edge ring 126 which contacts substrate 101). Alternatively, energy sources 138 may be configured provide pulsed and/or continuous energy in process chamber 100. In some embodiments, energy source 138 may be used to heat the back side of the substrate 101, for example, such as by being disposed below the substrate 101, or by directing the radiation to the back side of the substrate 101. Each energy source 138 is coupled to one or more power sources 170 which may be coupled to controller 140 to separately control each energy source 138. The temperatures at localized regions of the substrate 101 are measured by a plurality of temperature probe assemblies, such as 120, that passes through a through a hole that extends from the back side of the base 116 through the top of a reflector plate 102. The temperature probe assemblies 120 transmit sampled light from the reflecting cavity 118 to a pyrometer 128. The pyrometer 128 is connected to controller 140 which controls the power supplied to the lamp head 138 in response to a measured temperature. The energy sources 138 may be divided into multiple zones. The zones can be individually adjusted by the controller to allow controlled radiative heating of different areas of the substrate 101. In other embodiments, each light (LED or conventional light source) in energy sources 138 may be separately controlled to facilitate even finer control of the radiative heating.

In some embodiments, a cooling mechanism may be used to cool the energy sources 138. Some exemplary cooling mechanisms may include, for example, the use of heat sinks coupled to or grown on (as discussed below) a backside of the energy sources 138. In some embodiments, the substrate on which the light sources are mounted or grown on may itself be a heat sink used for cooling. In other embodiments, energy sources 138 may be cooled by a gas or liquid circulated around or proximate to the energy sources 138.

A substrate support 124 included in chamber 100 may include parts of a process kit 125 which may be adapted to work with various embodiments of substrate supports and/or process chambers. For example, the process kit 125 may include elements of the substrate support 124, such as edge ring 126 and an edge ring support 127.

During processing, the substrate 101 is disposed on the substrate support 124. The energy source 138 is a source of radiation (e.g., heat) and, in operation, generates a pre-determined temperature distribution across the substrate 101. In embodiments, where the heat source includes LEDs (as shown in FIG. 2), the energy source 138 may provide energy in wavelengths ranging from ultraviolet wavelengths to infrared wavelengths (e.g., about 10 nanometers (nm) to about 2000 nanometers (nm)). In some embodiments LED energy source 138 may provide energy in the microwave wavelength range. The LED Array 138 provides heat radiation that is absorbed by the substrate 101. Although some of the heat radiation produced by an LED source may be reflected, substantially all of the heat radiation that is not reflected is absorbed by the target component being heated. In embodiments described herein, the substrate 101 may bow, for example up to about 5 mm, during heating. Thus, in some embodiments, the LED energy source 138 should be placed just far enough away to avoid contact if the substrate 101 bows, but close enough to provide the necessary uniform heat energy to the target substrate. In some embodiments, the LED energy source 138 may be bowed or shaped to compensate for the target substrate deformation.

In the exemplary processing chamber 100 described above, energy source 138 may be used to illuminate and heat the surface of a substrate to process the near surface region of the substrate. LED light sources offer a variety of advantages including higher efficiency and more rapid response times. Pulse widths are selectable and can range to less than a millisecond to more than a second.

In some embodiments, LED arrays 138 may be used in conjunction with processing chambers to form films, treat dopants, change process gases (e.g., break bonds), and reorder the substrate itself. Additional high temperature substrate processing may benefit from LED heating as even higher output intensities become available. LEDs offer advantages when used to process the near surface region of a substrate. LEDs last a long time and allow the output intensity to be chosen independent from the wavelength(s) of the output illumination. Light emitting diodes (LEDs) may consist of gallium nitride, aluminum nitride, combinations thereof or other III-V materials grown on a substrate constructed to emit light close to one or more wavelengths determined by the bandgap of III-V materials in the active region. A phosphor may also be used to convert an emitted wavelength to a longer wavelength, reducing the energy of an emitted wavelength. It will be understood that the solid state sources described herein and depicted in the remaining figures may employ a phosphor in order to enhance absorption or enhance a chemical reaction.

Depending on the chemistries involved, illuminating a surface in the presence of gas precursor can enhance the rate of chemical reactions by thermal or other means. For example, the light may excite gas phase molecules, adsorbed molecules, or even excite the substrate to promote a chemical reaction on the surface. The wavelength of the LED may be selected to promote desirable film processes by, for example, choosing a wavelength which is resonant with a molecular electronic transition in order to enhance a reaction rate. The wavelength may also be chosen to enhance absorption of the radiation by the substrate, thereby heating the substrate more efficiently.

In some embodiments, each energy source 138 in FIG. 1 may include one large array of LEDs. However, depending on the heat energy and area to be heated, one large array of LEDs may require more power than can safely be provided without damage to the LEDs and associated circuitry. The inventors have observed that by modularizing LEDS into a plurality of smaller LED arrays, the smaller LED arrays can be more easily handled, manufactured, and powered. In addition, a plurality of smaller arrays of LEDs may also help in the event of LED failure. For example, in some embodiments, if one led fails and becomes an open circuit, then only the heat emitted from the small LED array is lost. If one large array of LEDs is used, then one LED failure may cause all processing to stop. In some embodiments, each of the plurality of smaller LED arrays can have different modules with different wavelengths. In some embodiments, each LED array can be removed and replaced with another LED array with different wavelengths.

Figure 2A:
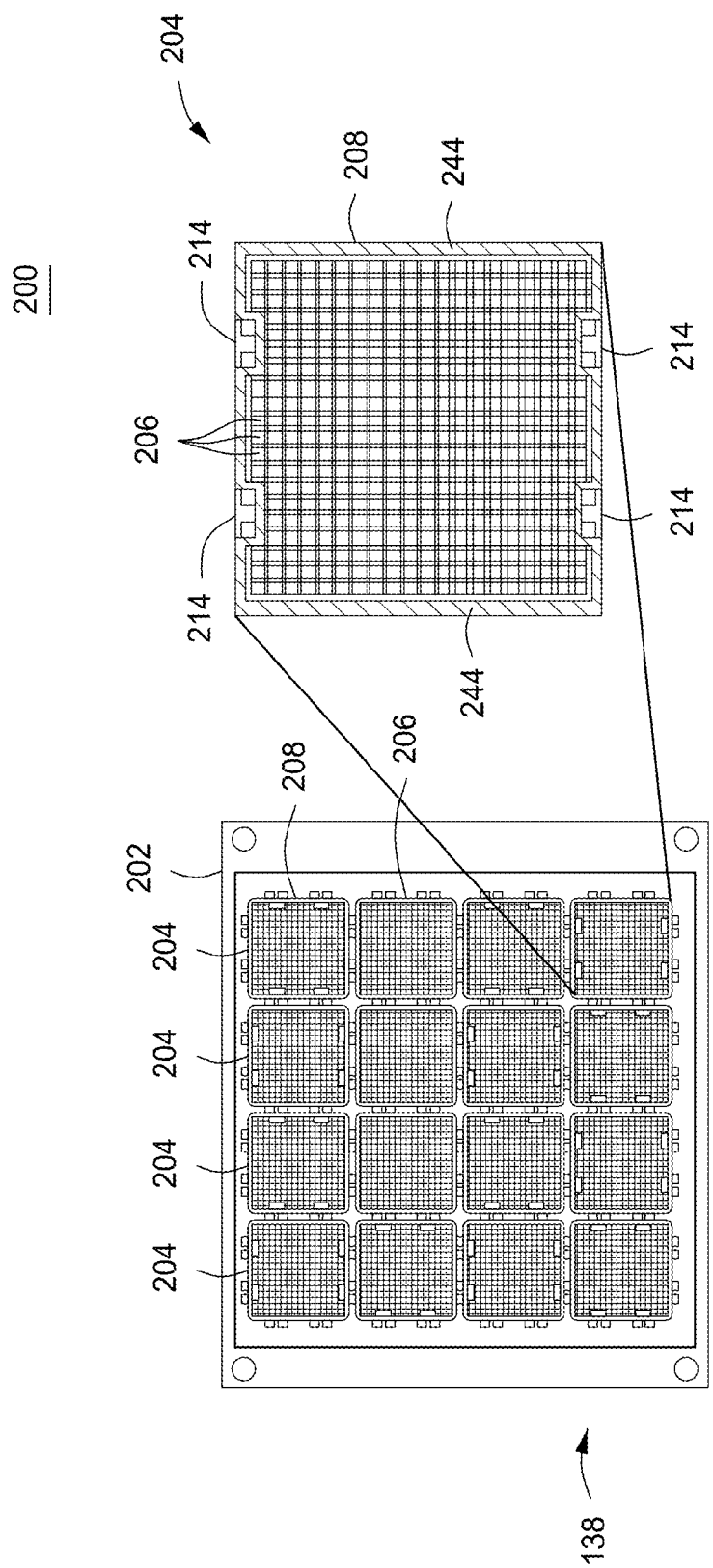
FIG. 2A is a top view of an solid state light source that includes a plurality of LED arrays in accordance with some embodiments of the present invention.

FIG. 2A shows at least one exemplary embodiment of an energy source 138 that includes a plurality of LED arrays 204 disposed on a LED substrate 202 for thermally processing other substrates and/or heating various processing chamber components disposed in the processing chamber.

Figure 2B:
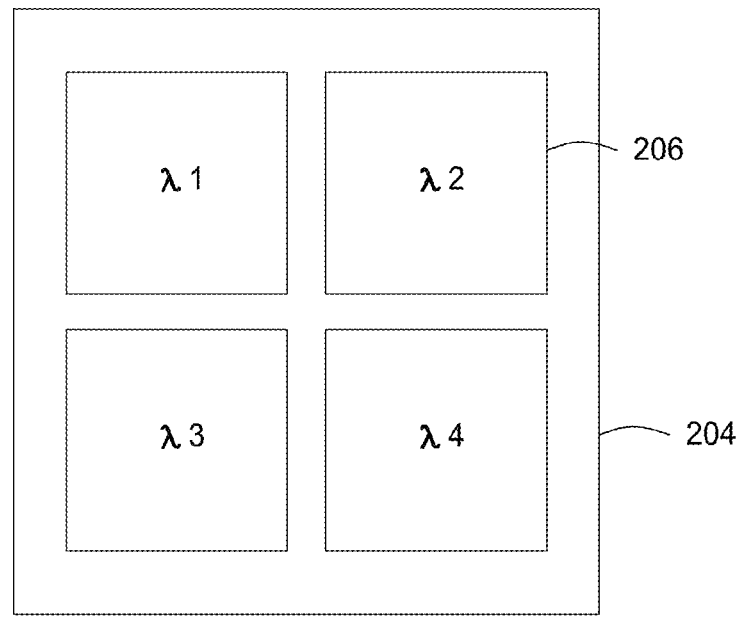
FIGS. 2B and 2C are schematic top views of arrays of LEDs with different wavelengths in accordance with some embodiments of the present invention.

In some embodiments, energy source 138 may illustratively be between 100 mm and 480 mm in length and between 100 mm and 480 mm in width. In addition, various size energy sources 138 may be used as required or desired in any particular application. In some embodiments, each LED array 204 may be about 20 mm by about 20 mm square, although other size LED arrays 204 may be used. Each LED array 204 may contain between about 300 and about 500 LEDs 206 (e.g., 384 LEDs as shown in FIG. 2B). LEDs 206 may be spaced between about 0.2 mm and about 1 mm apart. LED arrays 204 may be spaced between about 0.5 mm and about 4 mm apart.

Each LED 206 in LED arrays 204 may emit light and heat energy from one or more exposed surfaces. In some embodiments, all exposed surfaces of each LED 206 may emit light and heat energy. In some embodiments, each LED may be about 0.7 mm by about 0.7 mm square and about 0.3 mm in height, although other size LED 206 may be used. LEDs 204 may emit wavelengths in the UV (200-400 nm), VIS (400-700 nm) and NIR (700-1000 nm) wavelength ranges. The optical output of LEDs 204 are on the order of 1 W/mm^2 or greater, which corresponds to an intensity of 1e6 W/m^2 with sufficiently high packing densities. This is on the order magnitude required to achieve rapid thermal processing which means a wide range of intensities and applications are possible.

Figure 2C:
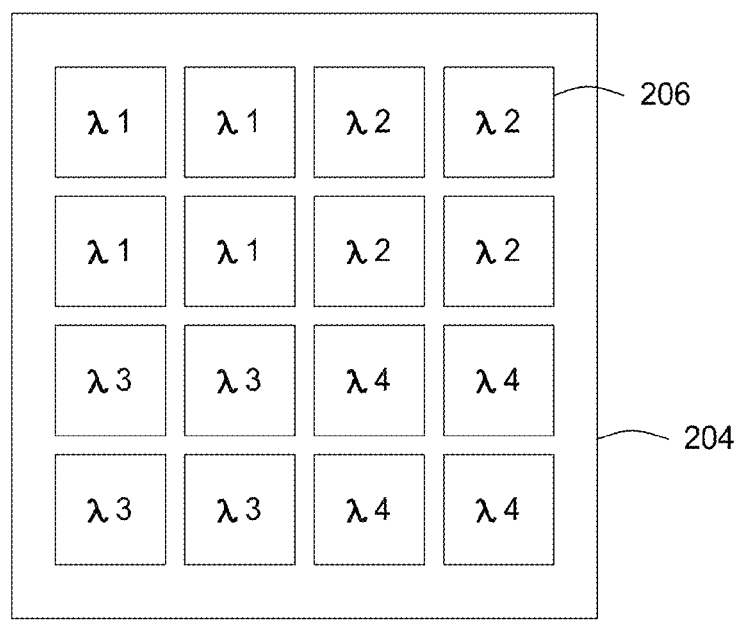

In some embodiments, the LED array 204 can be individual LED chips 206 with different wavelengths (as shown in FIG. 2B), or the LED array 204 can be a collection of LED lamps with different wavelengths (as shown in FIG. 2C). The LEDs can be multiplexed/rasterized such that certain LEDs with certain wavelengths are activated at one time. For example, at time 1t, only λ1 LEDs are active, at time 2t only λ2 LEDs are active, etc.

In some embodiments, each LED arrays 204 may be an integrated solution 200 including a plurality of LEDs 206, reflectors 208 disposed on one or more sides of the LED array 204, reflectors 210 disposed on one or more sides of each LED 206, electrical contact terminals 214 that may be coupled to a power source to supply power to the LED array 204, and an outer dam 244. In some embodiments, the integrated solution 200 may include all or some of the features described above. In addition, in some embodiments, the integrated solution 200 may include other layers or deposited material to electrically isolate or electrically connect the features described above.

In some embodiments, each LED 206 may be grown on base substrate 212 or on dielectric material layer 248. The LEDs 206 may be individually grown, grown in groups/sections, or grown all together at the same time. In some embodiments, the base substrate 212 and/or dielectric material layer 248 that LEDs 206 are grown on may be an n-type substrate, with an electrode (e.g., 214) attached to the p-type layer 240 deposited on its surface. P-type silicon substrates or sapphire substrates may be used as well. In some embodiments, the substrate can be any material that is thin enough, or has a high thermal conductivity, such that it is able to dissipate heat from the LEDs quickly while also providing electrical isolation of the LEDs from the rest of the system. In some embodiments, this can be done by using an electrically isolating material. LEDs can be grown on any material where the lattice structure of the substrate can be made to match the lattice structure of the LED material through, but not limited to, direct deposition, application of a buffer layer, and/or any type of stress relaxation. In some exemplary embodiments, the substrate can be ceramic. In some embodiments, islands of non-substrate material/chemistries may be grown or included in the substrate to help facilitate LED growth. In some embodiments, the solid state sources can be placed or mounted on the substrate as opposed to growing the solid state sources.

In some embodiments, the reflectors 208, 210 are configured to reflect the light and heat energy emitted from the LED towards the desired target (e.g., wafer substrate, or other process chamber component, etc.). In the case of LASERS, the reflectors 208, 210 could direct the light off of the LASER beams' axis to heat a wafer substrate or desired process chamber component. The reflectors 208 and 210 may be angled to reflect radiated LED light in a desired direction. In some embodiments, the angles of the incline of the reflector surfaces from the LED substrate 202 surface is between about 45 to 55 degrees from an axis of the LED extending in a direction toward where light energy is desired (e.g., for a planar array of LEDs, the axis may be perpendicular to the planar array), however, any angle which maximizes the angle and desired length of the reflector based on the space available between two neighboring LEDs 206, or LED arrays 204, may be used. In other embodiments, the surfaces of the reflectors 208, 210 may be perpendicular to the surface of the LED substrate 202. Still, in other embodiments, the surface of the LEDs 206 may be angled instead of, or in addition to, the surface of the reflector. In some embodiments, the height of the reflectors 208, 210 is at least the same height as the height of the LEDs 206, but may be higher or lower than the LEDs 206 as required.

Figure 3A:
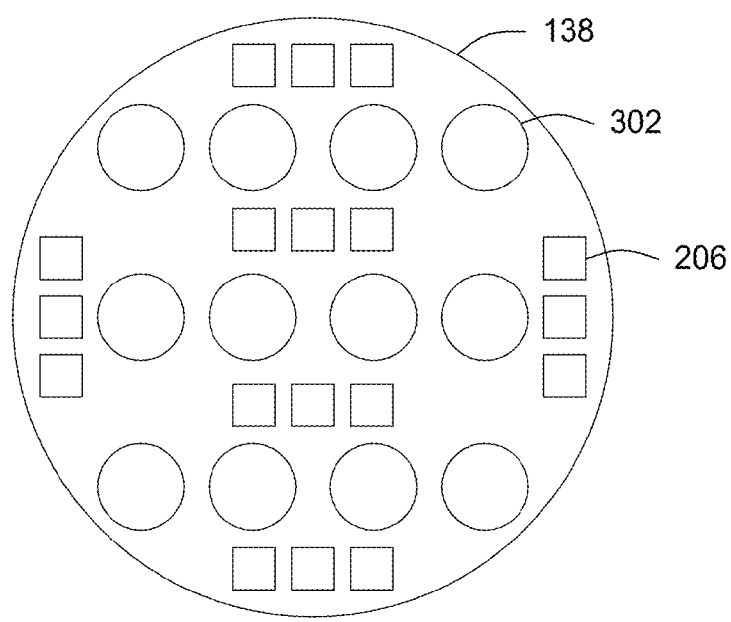
FIGS. 3A-3C are schematic top views of a conventional light source augmented with LED light sources in accordance with some embodiments of the present invention.

Referring to FIG. 3A, in some embodiments, the energy source 138 may be a conventional lights 302 augmented with LEDs 206 strewn about areas of the energy source 138 that had previously not been a light-emitting surface, increasing usage of the heat source surface area. The LEDs 206 may provide focused energy to the substrate for wavelength isolation and selective heating. For example, LEDs 206 could be placed along the edges of energy source 138 above an edge-ring around the substrate to provide more focused heating to the edge ring.

Figure 3B:
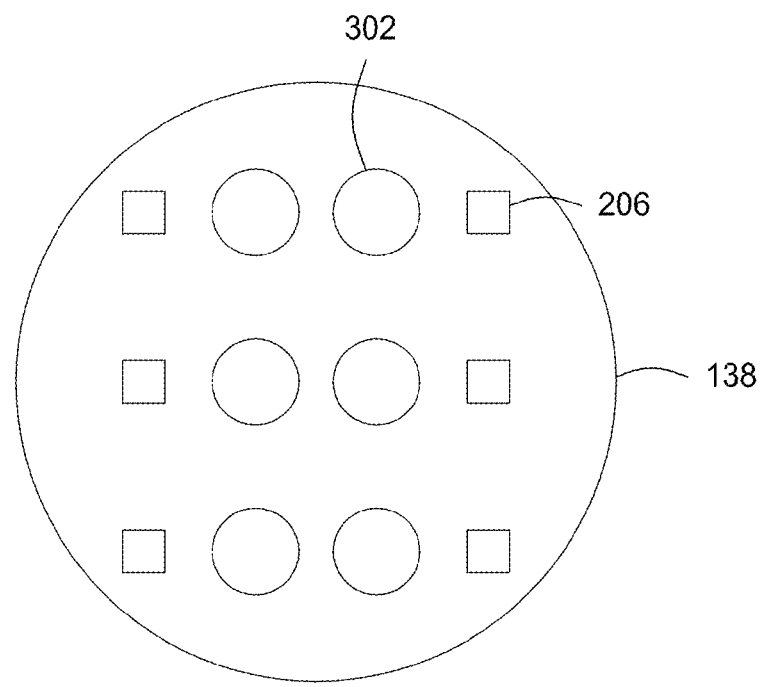

In some embodiments, as shown in FIG. 3B, LEDs 206 may replace some conventional lights 302 on the energy source 138 but continue to use the conventional lamp circuitry/connections to minimize the time and cost to retrofit convention lamp heads with LEDs. Thus, the LEDs 206 could be designed to fit into the conventional lamp sockets but emit light through the LED 206.

Figure 3C:
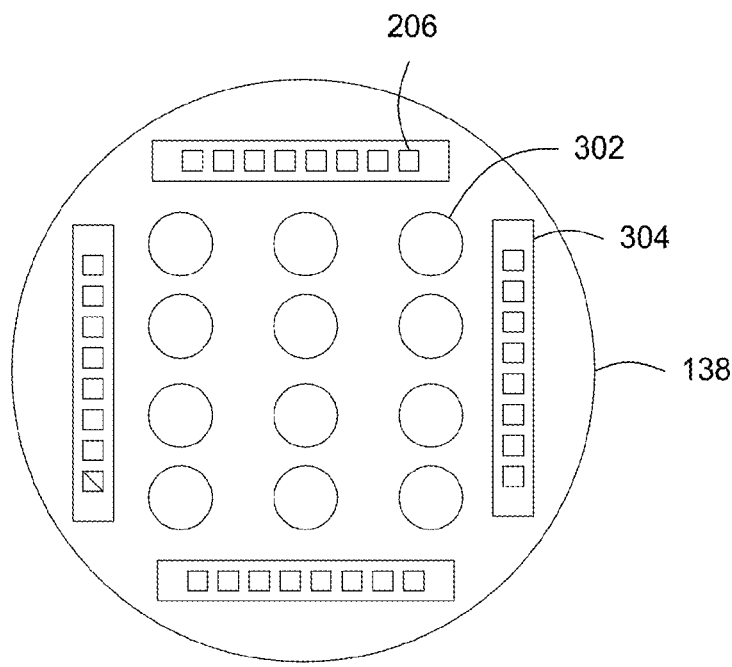

In some embodiments, as shown in FIG. 3C, printed circuit boards (PCB) 304 including one or more LEDs 206 on each PCB 304 may be disposed in various areas on the energy source 138. Each PCB 304 with LEDs 206 may be separately controllable. In some embodiments, each PCB 304 could be disposable and/or replaceable. In some embodiments, each replaceable/disposable PCB 304 could be overdriven to get flash-like temperatures and exposures to the substrate. In some embodiments, different wavelength PCB modules could be created and used as desired.

Figure 4:
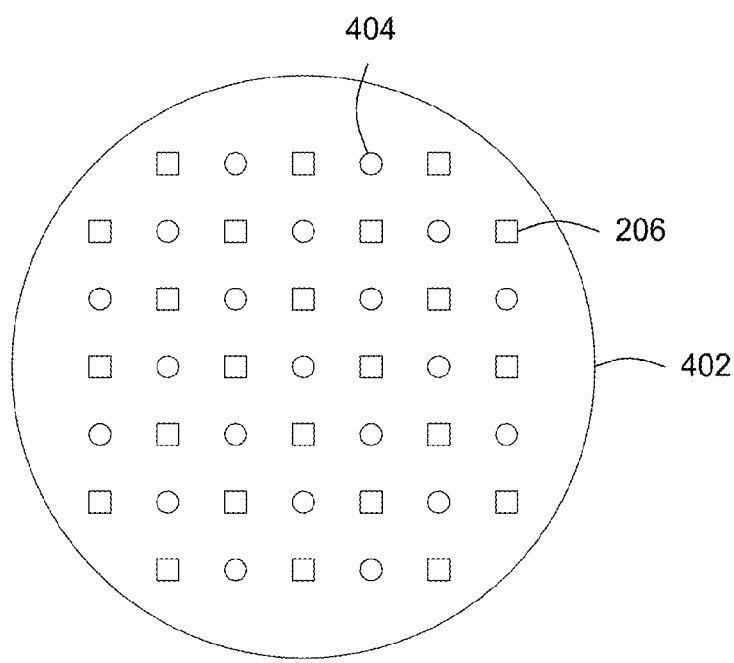
FIG. 4 is schematic top views of a shower head augmented with LED light sources in accordance with some embodiments of the present invention.

In some embodiments, the energy source 138 may be any component disposed in the process chamber that can accommodate LEDs 206 or arrays/PCBs of LEDs 204, 304. That is, LED modules or lamps can be arranged to form an array of radiant energy emitters which are arranged on a single surface or on all surfaces of the processing chamber, either as a separate system or as part of an integrated system. For example, in some embodiments, LEDs 206 may be arranged on a gas shower head generally used for plasma PVD or CVD processes. In FIG. 4, a shower head 402 is shown that includes a plurality of gas delivery nozzles 404. LEDs 206, or PCB arrays of LEDs 304, may be disposed about gas delivery nozzles 404 to essentially turn gas shower head 402 into an energy source 138. The LEDs may be operated simultaneously with gas delivery or sequentially during processing.

In some embodiments, the shower head 402 could be made from a material that allows LEDs 206 to grow on them. In other embodiments, a thin PCB may be placed over the shower head 402 with holes drilled for all the gas delivery nozzles 404. The PCB would leave space for LEDs to be placed. The LEDs 206 may then be coated with material that wouldn't corrode as it comes into contact with the process gasses. In some embodiments, a metal core PCB including an array of LEDs may be used. The metal core PCB may include electrical contacts on the back of the PCB board that could snap into a powered socket on the shower head 402.

Figure 5A:
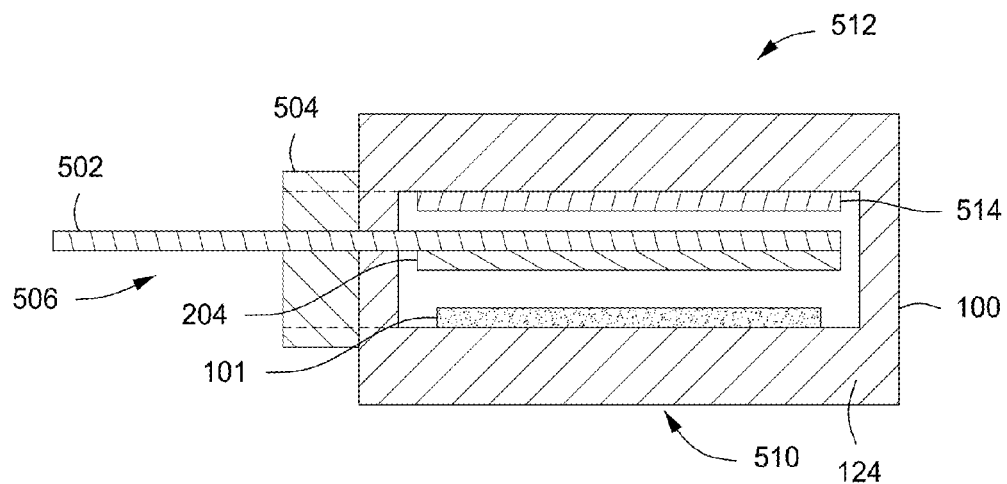
FIGS. 5A and 5B are schematic, cross-sectional side and top views, respectively, of a semiconductor substrate process chamber with a robot LED source in accordance with some embodiments of the present invention.
Figure 5B:
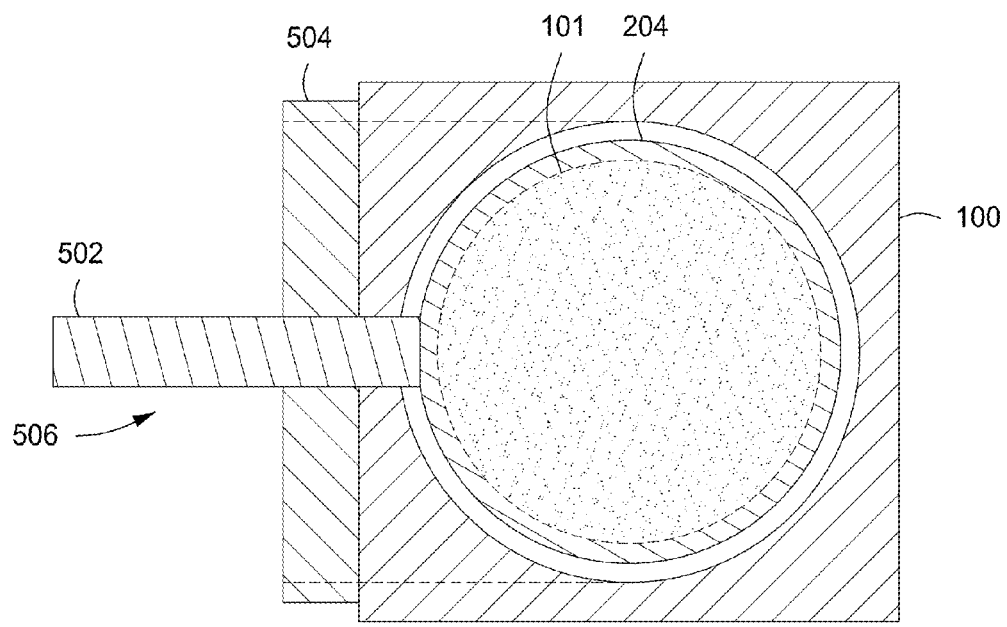

FIGS. 5A and 5B depict simplified schematic side and top views, respectively, of a process chamber 100 with an LED array 204 inserted via robot arm 502 for pre processing, post processing, intermittent processing, and/or sequential processing. Specifically, as described with respect to FIGS. 5A and 5B, in some embodiments, LED arrays may be inserted into the process chamber 100 as needed by a robotic arm 502 via a vacuum interlock 504 at the appropriate processing step for radiant energy delivery. The process chamber 100 may include and upper portion having a lid 512. In some embodiments, the lid 512 may support a target or shower head 514 depending on the type of process chamber. The process chamber 100 may also include a substrate support 124 disposed in a lower portion 510 of the process chamber to support a substrate 101 when disposed thereon. The LED heat source array 204 including a plurality of solid state light sources 206 may be inserted by robotic arm 504 between the lid 512 and the substrate support 124 to provide heat energy to the process chamber 100. This robot LED source 506 can be part of a larger cluster tool or specialized to an individual tool. The LED arrays are intended to supplement, replace or add new functionality to process chambers.

Some examples of potential applications of LED based energy sources 138 may include the use of LED based energy sources 138 for wavelength specific rapid thermal annealing of dopants. Specifically, in some embodiments, specific dopants will have different absorption properties and may prefer one wavelength over another for optimal annealing conditions. For example, silicon substrates absorb UV wavelengths with an absorption depth of 10s of nanometers, which may give advantages in improving shallow junction formation with local surface heating with UV LEDs. That is, if you flash UV light at high power for a very short time, the UV light will all get absorbed within the very top surface of the substrate. If the pulse is short enough, only that top layer of the substrate will be activated and modified leaving the rest if the substrate un-heated.

In other embodiments, LED based energy sources 138 may be used to deposit two dissimilar materials with different absorption properties, while limiting energy into one material without affecting the other (i.e. reflow of dielectrics).

In some embodiment, LED based energy sources 138 may allow for simpler UV light creation. The LED based energy sources 138 providing UV light could be placed at gas entrances to 'crack' the gases, or could be used for selective curing.

The following are advantages that can be realized by using the exemplary LED based energy sources 138 described above. Specifically, LEDs provide: (a) a small form factor (approx 1 mm square); (b) high intensities (~1e6 W/m"2) that provide rapid heating with quicker processing times; (c) single and/or multi-wavelength light source for film modification, substrate processing, and the like; (d) improved efficiency over conventional lamps (60-80%) and therefore less waste heat for thermal management; (e) faster switching time over conventional lamps (microseconds versus milliseconds); (f) UV LEDs are more environmentally friendly than toxic mercury vapor lamps; (g) multiple points of intensity control across the substrate for improved process uniformity; (h) efficient wavelength specific energy delivery to enable lower temperature processing; (i) in-situ, real time delivery of photons to a substrate or film during deposition; (j) lower cost of ownership and longer operating lifetime (~100 k hours); (k) modulation of light for energy delivery (i.e., "rasterized" energy delivery); and (l) reducing, if not eliminating, interference from with pyrometry.

While the foregoing is directed to embodiments of the present invention, other and further embodiments of the invention may be devised without departing from the basic scope thereof.

The invention claimed is:

1. An apparatus for providing pulsed or continuous energy in a process chamber, the apparatus comprising:
   a lamp head including a set of lamps, wherein the set of lamps are not solid state light sources; and
   a set of solid state light sources disposed on the lamp head to provide pulsed or continuous energy to the process chamber, wherein the set of solid state light sources includes a plurality of solid state light sources disposed on one or more printed circuit boards coupled to the lamp head.

2. The apparatus of claim 1, wherein the set of solid state light sources are light emitting diodes (LEDs).

3. The apparatus of claim 1, wherein the one or more printed circuit boards including the plurality of solid state light sources are removable.

4. The apparatus of claim 1, wherein the one or more printed circuit boards including the plurality of solid state light sources are coupled along the periphery of the lamphead.

5. The apparatus of claim 1, further comprising a controller, wherein the set of lamps and the set of solid state light sources are separately controllable by the controller.

6. An apparatus for providing pulsed or continuous energy in a process chamber, the apparatus comprising:
- a lamp head including a set of lamps, wherein the set of lamps are not solid state light sources; and
- a set of solid state light sources disposed on the lamp head to provide pulsed or continuous energy to the process chamber, wherein the set of solid state light sources includes groups of solid state light sources, wherein each group of solid state light sources is separately controllable by a controller, and wherein each group includes solid state light sources that at least one of all emit the same wavelength of light or are capable of emitting different wavelengths of light.

7. The apparatus of claim 1, wherein the set of solid state light sources are configured to connect to sockets used by the set of lamps.

8. An apparatus for providing pulsed or continuous energy in a process chamber, the apparatus comprising:
- a shower head including a plurality of gas delivery nozzles to provide process gases to the process chamber to process a substrate; and
- a set of solid state light sources disposed on the shower head to provide pulsed or continuous energy to the process chamber, wherein the set of solid state light sources includes a plurality of solid state light sources disposed on one or more printed circuit boards removably coupled to the shower head.

9. The apparatus of claim 8, wherein the set of solid state light sources are light emitting diodes (LEDs).

10. The apparatus of claim 8, wherein the set of solid state light sources are disposed about the plurality of gas delivery nozzles.

11. The apparatus of claim 8, further comprising a controller, wherein each of the solid state light sources is separately controllable by the controller.

12. The apparatus of claim 11, wherein the set of solid state light sources includes groups of solid state light sources.

13. The apparatus of claim 12, wherein each group of solid state light sources is separately controllable by the controller.

14. An apparatus for providing pulsed or continuous energy in a process chamber, the apparatus comprising:
- a process chamber body of the process chamber having an upper portion including a lid;
- a substrate support disposed in a lower portion of the process chamber body to support a substrate when disposed thereon;
- an energy source array including a plurality of solid state light sources to provide pulsed or continuous heat energy to the process chamber, wherein the plurality of solid state light sources includes groups of solid state light sources, wherein each group of solid state light sources is separately controllable by a controller, and wherein each group includes solid state light sources that at least one of all emit the same wavelength of light or are capable of emitting different wavelengths of light; and
- a transfer robot to transfer the energy source array to and from the process chamber body between the lid and the substrate support.

15. The apparatus of claim 14, wherein the plurality of solid state light sources are light emitting diodes (LEDs).

16. An apparatus for providing pulsed or continuous energy in a process chamber, the apparatus comprising:
- a shower head including a plurality of gas delivery nozzles to provide process gases to the process chamber to process a substrate; and
- a set of solid state light sources disposed on the shower head to provide pulsed or continuous energy to the process chamber, wherein the set of solid state light sources includes groups of solid state light sources, wherein each group of solid state light sources is separately controllable by a controller, and wherein each group includes solid state light sources that at least one of all emit the same wavelength of light or are capable of emitting different wavelengths of light.

* * * * *